United States Patent
Takagi et al.

(10) Patent No.: US 10,966,326 B2
(45) Date of Patent: Mar. 30, 2021

(54) WIRING SUBSTRATE AND METHOD FOR MANUFACTURING WIRING SUBSTRATE

(71) Applicant: IBIDEN CO., LTD., Ogaki (JP)

(72) Inventors: Kotaro Takagi, Ogaki (JP); Yoji Mori, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/843,925

(22) Filed: Apr. 9, 2020

(65) Prior Publication Data
US 2020/0329568 A1    Oct. 15, 2020

(30) Foreign Application Priority Data

Apr. 11, 2019  (JP) .............................. JP2019-075873

(51) Int. Cl.
| | |
|---|---|
| *H05K 1/11* | (2006.01) |
| *H05K 3/42* | (2006.01) |
| *H05K 3/46* | (2006.01) |
| *H05K 1/18* | (2006.01) |
| *H05K 3/00* | (2006.01) |

(52) U.S. Cl.
CPC ........... *H05K 3/4644* (2013.01); *H05K 1/111* (2013.01); *H05K 1/115* (2013.01); *H05K 1/181* (2013.01); *H05K 3/0011* (2013.01); *H05K 3/42* (2013.01); *H05K 2201/09509* (2013.01)

(58) Field of Classification Search
CPC ........ H05K 1/115; H05K 1/112; H05K 1/113; H05K 1/114; H05K 1/116; H05K 3/4038; H05K 3/4053; H05K 3/4061; H05K 3/4069; H05K 3/42; H05K 3/425; H05K 3/426; H05K 3/427; H05K 3/428; H05K 3/429; H05K 3/4623; H05K 3/4679; H05K 3/4638
See application file for complete search history.

(56) References Cited

U.S. PATENT DOCUMENTS

2003/0183421 A1* 10/2003 Dishongh ............ H05K 3/3436
                                                              174/262
2019/0254175 A1*  8/2019 Stanzmann ............... H05K 3/36

FOREIGN PATENT DOCUMENTS

JP    2014-230010 A    12/2014

* cited by examiner

*Primary Examiner* — Jeremy C Norris
(74) *Attorney, Agent, or Firm* — Oblon, McClelland, Maier & Neustadt, L.L.P.

(57) ABSTRACT

A wiring substrate includes a laminate having a through hole and including conductor layers and insulating layers interposed between the conductor layers, solder resist layers formed on the laminate and including a first solder resist layer covering first surface of the laminate and a second solder resist layer covering second surface of the laminate and that the first and second solder resist layers have openings exposing the through hole, and a resin film covering the laminate not covered by the solder resist layers such that the resin film is formed on the first and second surfaces of the laminate inside the openings of the first and second solder resist layers without overlapping with the solder resist layers on the first and second surfaces and that the resin film covers inner wall surface inside the through hole and at least part of the first and second surfaces exposed inside the openings.

20 Claims, 5 Drawing Sheets

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2019-075873, filed Apr. 11, 2019, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2014-230010 describes a wiring substrate in which a rigid substrate is used. This wiring substrate has an opening part penetrating the wiring substrate in a predetermined region including a region opposing a semiconductor chip mounted on the wiring substrate. The entire contents of this publication are incorporated herein by reference.

SUMMARY OF THE INVENTION

According to one aspect of the present invention, a wiring substrate includes a laminate having a through hole and including conductor layers and insulating layers interposed between the conductor layers respectively such that the through hole penetrates through the laminate in the thickness direction of the laminate, solder resist layers formed on the laminate such that the solder resist layers include a first solder resist layer covering a first surface of the laminate and a second solder resist layer covering a second surface of the laminate on the opposite side with respect to the first surface and that the first and second solder resist layers have openings exposing the through hole respectively, and a resin film partially covering exposed surfaces of the laminate not covered by the solder resist layers such that the resin film is formed on the first and second surfaces of the laminate inside the openings of the first and second solder resist layers without overlapping with the first and second solder resist layers on the first and second surfaces and that the resin film covers an inner wall surface inside the through hole and at least part of the first and second surfaces exposed inside the openings.

According to another aspect of the present invention, a method for manufacturing a wiring substrate includes preparing a laminate including conductor layers and insulating layers interposed between the conductor layers respectively, forming solder resist layers on the laminate such that the solder resist layers include a first solder resist layer covering a first surface of the laminate and a second solder resist layer covering a second surface of the laminate on the opposite side with respect to the first surface and that the first and second solder resist layers have openings respectively, forming a through hole penetrating through the laminate in the thickness direction of the laminate such that the first and second solder resist layers have the openings exposing the through hole respectively, and forming a resin film partially covering exposed surfaces of the laminate not covered by the solder resist layers such that the resin film is formed on the first and second surfaces of the laminate inside the openings of the first and second solder resist layers without overlapping with the first and second solder resist layers on the first and second surfaces and that the resin film covers an inner wall surface inside the through hole and at least part of the first and second surfaces exposed inside the openings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
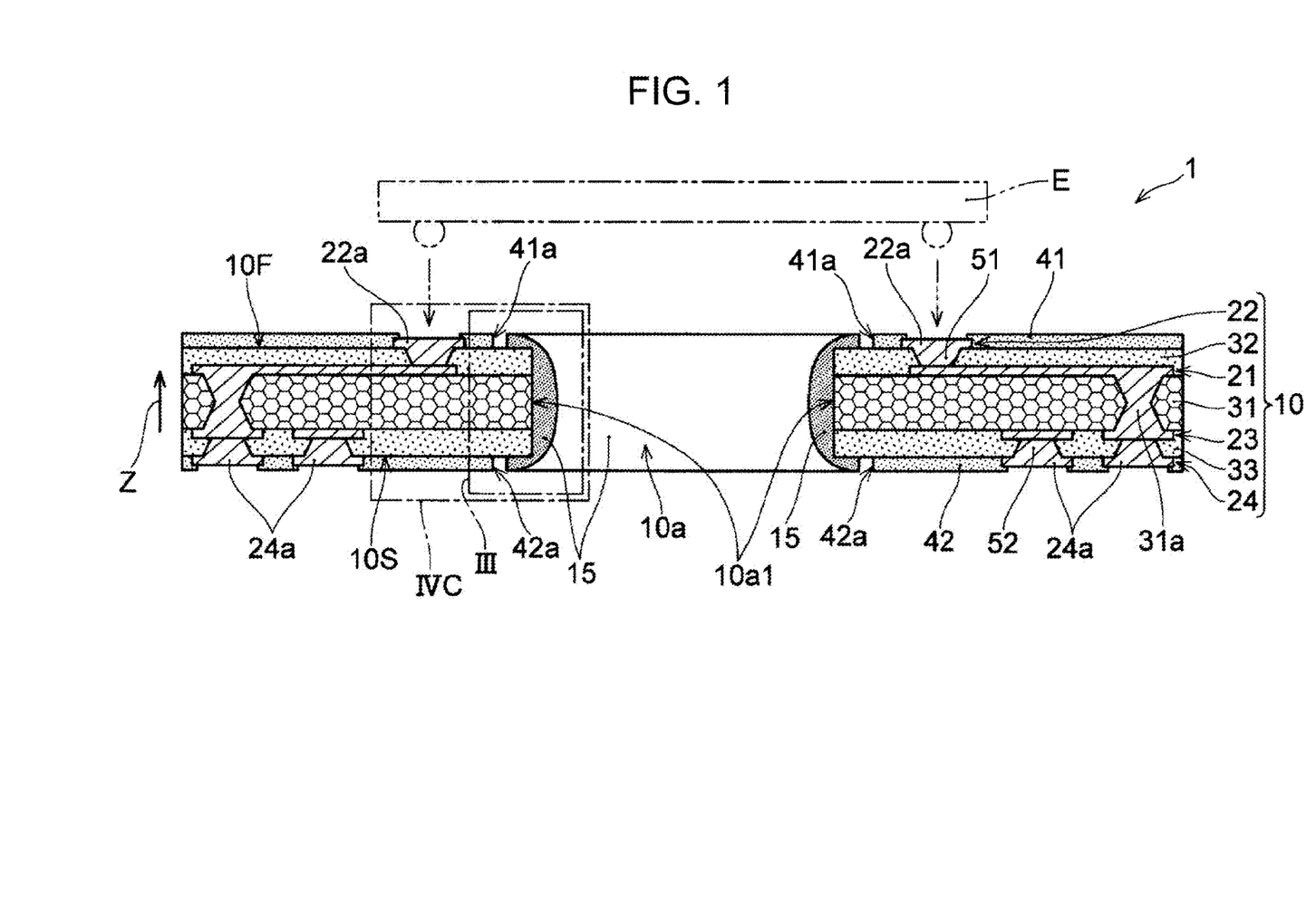
FIG. 1 is a cross-sectional view illustrating an example of a wiring substrate of an embodiment of the present invention.
Figure 2:
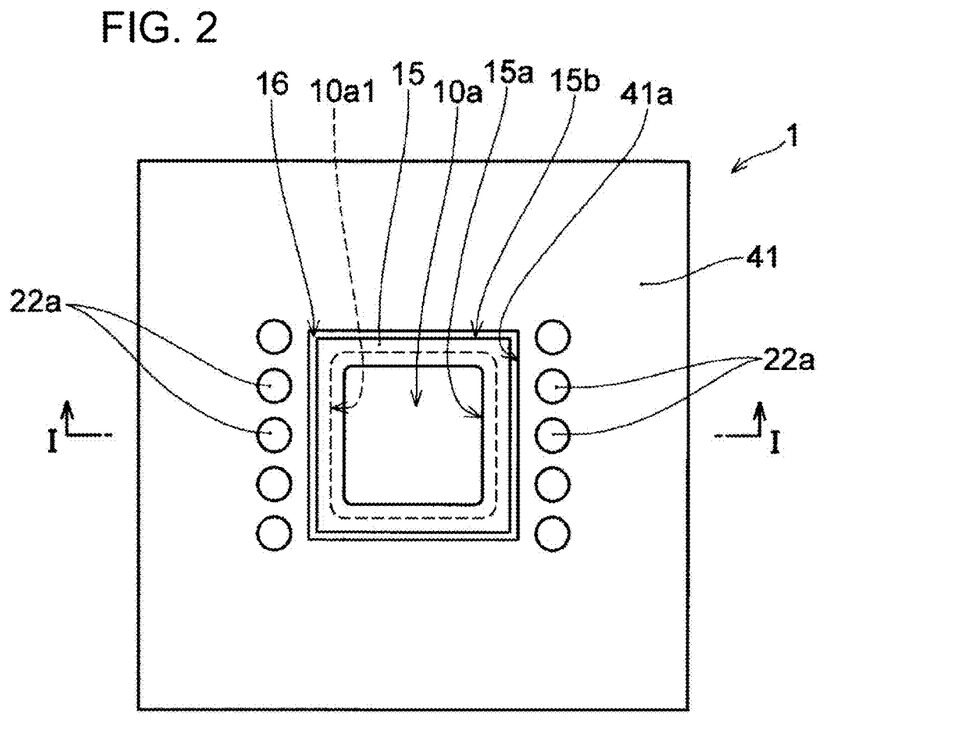
FIG. 2 is a plan view illustrating the wiring substrate in the example of FIG. 1.

A wiring substrate of an embodiment of the present invention is described with reference to the drawings. FIGS. 1 and 2 respectively illustrate a cross-sectional view and a plan view of a wiring substrate 1 with is an example of the wiring substrate of the embodiment. FIG. 1 is a cross-sectional view along an I-I line illustrated in FIG. 2. As illustrated in FIGS. 1 and 2, the wiring substrate 1 includes a laminate 10 of insulating layers and conductor layers, a solder resist layer (first resin film) 41, and a solder resist layer (second resin film) 42. The laminate 10 has a first surface (10F) which is one of two surfaces orthogonal to a thickness direction of the wiring substrate 1, and a second surface (10S) which is a surface on an opposite side with respect to the first surface (10F). The laminate 10 includes two or more conductor layers (first-fourth conductor layers (21, 22, 23, 24) in the example of FIG. 1), and insulating layers (first-third insulating layers (31, 32, 33) in the example of FIG. 1) respectively interposed between the two or more conductor layers. The laminate 10 further has a through hole (10a) penetrating the laminate 10 in the thickness direction. The solder resist layer 41 covers the first surface (10F) of the laminate 10, and the solder resist layer 42 covers the second surface (10S) of the laminate 10. The solder resist layer 41 has an opening (41a) exposing the through hole (10a), and the solder resist layer 42 has an opening (42a) exposing the through hole (10a).

The wiring substrate 1 further includes a resin film 15 (third resin film) that partially covers exposed surfaces of the laminate 10 that are not covered by the solder resist layers (41, 42). The resin film 15 is formed from one of the first surface (10F) and the second surface (10S) of the laminate 10 to the other one of the first surface (10F) and the second surface (10S) of the laminate 10 through inside of the through hole (10a), and covers an inner wall surface (10a1) of the through hole (10a). As illustrated in FIG. 2, in the present embodiment, the inner wall surface (10a1) of the through hole (10a) is covered by the resin film 15 over an entire circumference thereof in a plan view.

As will be described later, the through hole (10a) may be formed by, for example, laser processing, or mechanical processing such as drilling. On the inner wall surface of the through hole (10a), which can be a surface cut by such processing, cutting chips due to the processing may remain without being removed. When a circuit substrate such as the wiring substrate 1 is used, the remaining cutting chips may be released from the inner wall surface of the through hole and become dust. Then, such dust may float in the through hole (10a) or adhere to a surface of the wiring substrate 1 and/or a surface of a component (E) mounted on the wiring substrate 1.

However, in the present embodiment, the inner wall surface (10a1) of the through hole (10a) is covered by the resin film 15. Therefore, even when cutting chips of conductive or insulating materials that form the conductor layers and the insulating layers of the laminate 10 remain on the inner wall surface (10a1) of the through hole (10a), such cutting chips cannot be released into the through hole (10a). Therefore, it is thought that dusts including the cutting chips and the like are prevented from affecting a function of a component (E) that can be mounted on the wiring substrate 1.

Further, the resin film 15 partially covers the first surface (10F) of the laminate 10 exposed inside the opening (41a) of the solder resist layer 41. Further, the resin film 15 partially covers the second surface (10S) of the laminate 10 exposed inside the opening (42a) of the solder resist layer 42. That is, the resin film 15 continuously covers portions of the first surface (10F) and the second surface (10S) of the laminate 10 that surround the through hole (10a) and covers the inner wall surface (10a1) of the through hole (10a). Therefore, it is thought that peeling between the resin film 15 and the laminate 10 is less likely to occur as compared to a case where the resin film 15 is formed only on the inner wall surface (10a1). As will be described later, the resin film 15 may cover the entire portions of the first surface (10F) and the second surface (10S) of the laminate 10 that are respectively exposed in the openings (41a, 42a), and at least partially covers these exposed portions.

Further, the resin film 15 is formed inside the opening (41a) so as not to overlap with the solder resist layer 41 on the first surface (10F) of the laminate 10, and is formed inside the opening (42a) so as not to overlap with the solder resist layer 42 on the second surface (10S) of the laminate 10. Therefore, occurrence of a crack in the resin film 15 or the solder resist layers (41, 42) in an overlapping portion between the resin film 15 and the solder resist layers (41, 42) can be prevented.

In the wiring substrate 1 illustrated in FIGS. 1 and 2, inner edges of the openings (41a, 42a) of the solder resist layers (41, 42) are respectively separated from edges of the resin film 15 on the first surface (10F) and the second surface (10S) of the laminate 10. Therefore, the first surface (10F) of the laminate 10 is exposed between the solder resist layer 41 and the resin film 15. A slit having an inner wall formed of the resin film 15 and an inner wall formed of the solder resist layer 41 opposing each other is formed surrounding the through hole (10a) on the first surface (10F). Further, the second surface (10S) of the laminate 10 is exposed between the solder resist layer 42 and the resin film 15. A slit having an inner wall formed of the resin film 15 and an inner wall formed of the solder resist layer 42 opposing each other is formed surrounding the through hole (10a) on the second surface (10S).

In the wiring substrate 1 in the example of FIG. 1, a core substrate of the wiring substrate 1 is formed by a first insulating layer 31 and a first conductor layer 21 and a third conductor layer 23 that are respectively laminated on both sides of the first insulating layer 31. A build-up layer including a second insulating layer 32 and a second conductor layer 22 and a build-up layer including a third insulating layer 33 and a fourth conductor layer 24 are formed sandwiching the core substrate therebetween. In the first insulating layer 31, through-hole conductors (31a) connecting the first conductor layer 21 and the third conductor layer 23 to each other are formed. The number of the conductor layers and the number of the insulating layers included in the laminate 10 are not limited to those in the example of FIG. 1. For example, it is also possible that the laminate 10 includes only the first insulating layer 31 and the first and third conductor layers (21, 23), or includes build-up layers each including two or more conductor layers and two or more insulating layers.

In the description of the wiring substrate 1, a side farther from the first insulating layer 31 in the thickness direction of the wiring substrate 1 is also referred to as an "upper side" or simply "upper," and a side closer to the first insulating layer 31 is also referred to as a "lower side" or simply "lower." Further, for the conductor layers and the insulating layers, a surface facing an opposite side with respect to the first insulating layer 31 is also referred to as an "upper surface," and a surface facing the first insulating layer 31 side is also referred to as a "lower surface." Further, the thickness direction of the wiring substrate 1 is also simply referred to as a "Z direction."

The first surface (10F) and the second surface (10S) of the laminate 10 are respectively formed by portions of surfaces orthogonal to the Z direction of the conductor layers and the insulating layers of the laminate 10 that are not in contact with other conductor layers and other insulating layers of the laminate 10. Therefore, in the example of FIG. 1, in a region where a conductor pattern of the second conductor layer 22 is formed, an upper surface of the second conductor layer 22 is the first surface (10F), and, in a region where a conductor pattern of the second conductor layer 22 is not formed, an upper surface of the second insulating layer 32 is the first surface (10F). Similarly, in a region where a conductor pattern of the fourth conductor layer 24 is formed, an upper surface of the fourth conductor layer 24 is the second surface (10S), and, in a region where a conductor pattern of the fourth conductor layer 24 is not formed, an upper surface of the third insulating layer 33 is the second surface (10S).

The conductor layers (first-fourth conductor layers (21-24)) can each include a metal foil, an electroless plating film and an electrolytic plating film. The conductor layers can each be formed, for example, using any metal such as copper, nickel, silver, or palladium alone or using two or more of these metals in combination.

The insulating layers (first-third insulating layers (31-33)) can each be formed using any insulating material. Examples of insulating materials include an epoxy resin, a bismale-imide triazine resin (BT resin), a phenol resin, and the like. The insulating layers formed using these resins may each contain a reinforcing material such as a glass fiber or an aramid fiber, and/or inorganic filler such as silica.

The second insulating layer 32 includes via conductors 51 that penetrate the second insulating layer 32 and connect the first conductor layer 21 and the second conductor layer 22 to each other. The third insulating layer 33 includes via conductors 52 that penetrate the third insulating layer 33 and connect the third conductor layer 23 and the fourth conductor layer 24 to each other. The via conductors (51, 52) are so-called filled vias formed by filling through holes penetrating the second and third insulating layers (32, 33) with conductors. Each of the via conductors (51, 52) is integrally formed with a conductor layer on an upper side thereof. Therefore, the via conductors (51, 52) are each formed by, for example, an electroless plating film and an electrolytic plating film of copper, nickel, or the like. The through-hole conductors (31a) are also each formed by an electroless plating film and an electrolytic plating film of copper, nickel, or the like.

The second conductor layer 22 as an outermost conductor layer on the first surface (10F) side of the laminate 10 has connection pads (22a) for a component (E) to be mounted on the wiring substrate 1. As in the example of FIG. 1, the component (E) can be mounted on the wiring substrate 1 in a manner straddling the through hole (10a). In this case, the component (E) may be an electronic component that includes optical elements including light receiving elements or light emitting elements such as imaging elements that receive or emit light passing through the through hole (10a). The component (E) may be an electronic component having a wireless communication function of receiving or transmitting radio waves passing through the through hole (10a), or may be an optical component such as a lens.

When such a component (E) is mounted on the wiring substrate 1, the through hole (10a) can function as an optical path or a waveguide. When dust floats in the through hole (10a) that can have such a function, there is a risk that the function of component (E) may be affected by the dust. However, in the present embodiment, due to the resin film 15, such a situation can be avoided. It is thought that this can contribute to quality improvement of an electronic device in which the wiring substrate 1 is used.

The fourth conductor layer 24 as an outermost conductor layer on the second surface (10S) side of the laminate 10 may include connection pads (22a) for a component (E) to be mounted on the wiring substrate 1 in a manner straddling the through hole (10a). One of the second and fourth conductor layers (22, 24) may be provided with connection pads (22a, 24a), or both the conductor layers may be provided with connection pads (22a).

In the example of FIG. 1, the fourth conductor layer 24 includes multiple connection pads (24a). The connection pads (22a) included in the second conductor layer 22 described above can each be electrically connected to one or more of the multiple connection pads (24a) via the via conductors 51, the first conductor layer 21, the through-hole conductors (31a), the third conductor layer 23 and the via conductors 52. Although not illustrated in the drawings, a surface protective film formed of Au, Ni/Au, Ni/Pd/Au, solder, heat-resistant pre-flux, or the like may be formed on a surface of each of the connection pads (22a, 24a).

The solder resist layer 41 may have openings exposing the connection pads (22a) in addition to the, opening (41a). The solder resist layer 42 may have openings exposing the connection pads (24a) in addition to the, opening (42a). The solder resist layers (41, 42) can be formed using any insulating material. The material of the solder resist layers (41, 42) can contain, for example, an epoxy resin, a polyimide resin, or the like as a main raw material.

The resin film 15 can also be formed using any resin material. The material of the resin film 15 can contain an epoxy resin, silicone resin, an acrylic resin, or the like as a main raw material.

As illustrated in FIG. 2, the through hole (10a) of the wiring substrate 1 of FIG. 1 has a rectangular planar shape as a whole, and is formed substantially at a central portion of the wiring substrate 1. An innermost solid line of four concentric squares drawn in a center portion of the wiring substrate 1 in FIG. 2 indicates an inner-side surface (15a) of the resin film 15. A broken line drawn next to the inner-side surface (15a) of the resin film 15 indicates the inner wall surface (10a1) of the through hole (10a). Further, a solid line that is drawn adjacent to and on an outer side of the inner wall surface (10a1) indicates an outer edge (15b) of the resin film 15, and a solid line drawn on a further outer side indicates the inner edge of the opening (41a) of the solder resist layer 41.

As illustrated in FIG. 2, the inner edge of the opening (41a) of the solder resist layer 41 is positioned on an outer side of an outer edge (15b) of the resin film 15 in a plan view. Although not illustrated in FIG. 2, the inner edge of the opening (42a) of the solder resist layer 42 is also positioned on an outer side of an outer edge (15b) of the resin film 15 in a plan view.

The resin film 15 is formed over the entire circumference of the through hole (10a), and has a frame-like planar shape. The resin film 15 covers the inner wall surface (10a1) of the through hole (10a) over the entire circumference of the through hole (10a). Therefore, a contiguous frame-shaped slit (groove) 16 having the outer edge (15b) of the resin film 15 and the inner edge of the opening (41a) of the solder resist layer 41 as opposing inner walls is formed around the through hole (10a) on the first surface (10F) of the laminate 10 (see FIG. 1). The through hole (10a) is surrounded by frame-shaped slits 16 respectively on the first surface (10F) and the second surface (10S) of the laminate 10.

In the example of FIG. 2, the multiple connection pads (22a) are arranged along and on outer sides of two opposing sides of the through hole (10a). A component (E) (see FIG. 1) to be mounted on the wiring substrate 1 can be mounted on the wiring substrate 1, for example, in a manner straddling the through hole (10a), and predetermined terminals of the component (E) (not illustrated in the drawings) can be connected to the connection pads (22a). Without being limited to the example of FIG. 2, the connection pads (22a) can be provided at any positions and in any number according to the component (E). For example, the connection pads (22a) may be arranged along and on outer sides of four sides of the substantially rectangular through hole (10a).

Figure 3:
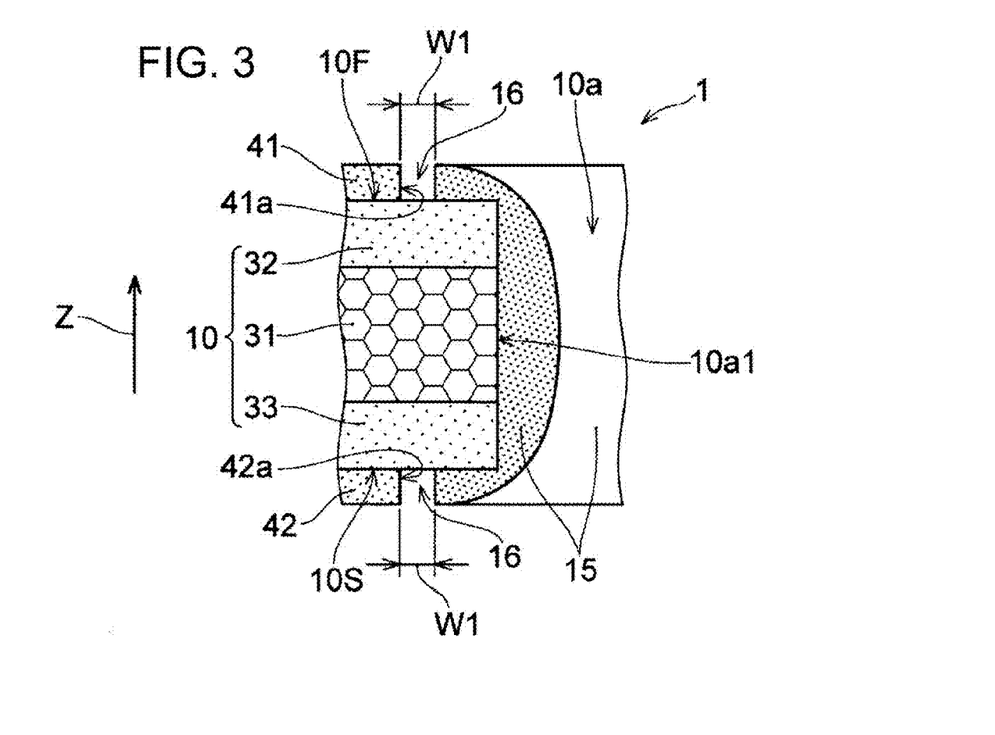
FIG. 3 is an enlarged view of a portion (III) of FIG. 1.

FIG. 3 illustrates an enlarged view of a portion (III) of FIG. 1. As illustrated in FIG. 3, in the laminate 10, in a region near the through hole (10a), conductor patterns of the second and fourth conductor layers (22, 24) (see FIG. 1) are not formed. Therefore, the first surface (10F) and the second surface (10S) of the laminate 10 are respectively formed of the upper surfaces of the second and third insulating layers (32, 33). Then, in the wiring substrate 1, the inner edge of the opening (41a) of the solder resist layer 41 is positioned on an outer side of the inner wall surface (10a1) of the through hole (10a). Therefore, the first surface (10F) of the laminate 10 is exposed inside the opening (41a) near the through hole (10a), and the resin film 15 is formed on this exposed portion which is formed of the upper surface of the second insulating layer 32. Similarly, the inner edge of the opening (42a) of the solder resist layer 42 is positioned on an outer side of the inner wall surface (10a1) of the through hole (10a). Therefore, the second surface (10S) of the laminate 10 is exposed inside the opening (42a) near the through hole (10a), and the resin film 15 is formed on this exposed portion which is formed of the upper surface of the third insulating layer 33.

In order to be able to firmly adhere to the second conductor layer 22 or the fourth conductor layer 24, the second and third insulating layers (32, 33) can each have a moderately rough upper surface. Therefore, it is thought that the first surface (10F) and the second surface (10S) of the laminate 10 can firmly adhere to the resin film 15. Therefore, it is thought that, in the wiring substrate 1, peeling between the resin film 15 and the laminate 10 is unlikely to occur.

A gap between the inner edge of each of the openings (41a, 42a) of the solder resist layers (41, 42) and the resin film 15, that is, a width (W) of the slit 16, is, for example, 10 µm or more and 100 µm or less. When the resin film 15 and the solder resist layers (41, 42) are designed such that the width (W) is in such a range, it is thought that unintentionally overlapping between resin film 15 and the solder resist layers (41, 42) when the wiring substrate 1 is manufactured can be prevented. Further, the connection pads (22a) can be arranged at positions relatively close to the through hole (10a).

As illustrated in FIG. 3, a surface of a portion of the resin film 15 covering the inner wall surface (10a1) of the through hole (10a) is curved to be convex toward the inner side of the through hole (10a). That is, the resin film 15 on the inner wall surface (10a1) of the through hole (10a) is thick in a central portion in the Z direction and is thin near the first surface (10F) and the second surface (10S). In the example of FIG. 3, the first insulating layer 31 that forms a central portion in the Z direction of the wiring substrate 1 is a core layer of the wiring substrate 1. Therefore, the first insulating layer 31 may contain a reinforcing material such as a glass fiber or an aramid fiber in order to have appropriate rigidity. When the first insulating layer 31 contains such a fibrous material, fiber waste cut due to the formation of the through hole (10a) may protrude relatively long from the central portion in the Z direction of the inner wall surface (10a1). The resin film 15 having a curved surface as in the example of FIG. 3 is preferable in that such fiber waste can be easily covered without being exposed.

Figure 4A:
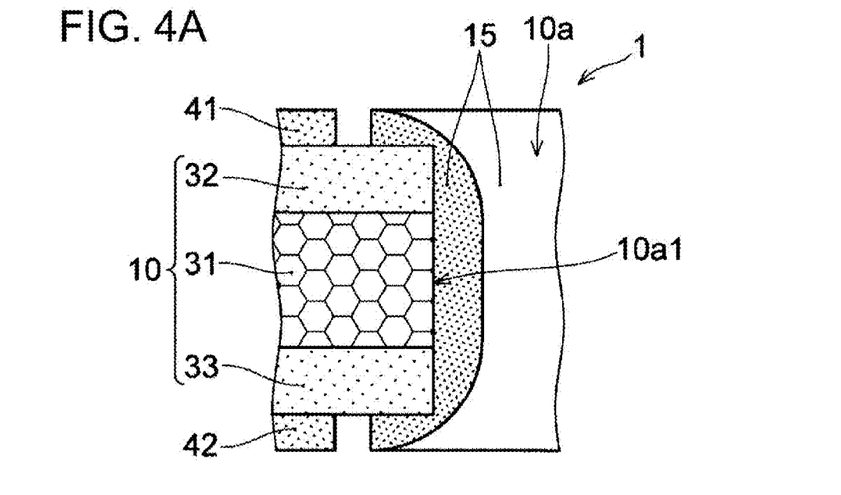
FIG. 4A is a cross-sectional view illustrating a modified embodiment of the wiring substrate of FIG. 1.
Figure 4B:
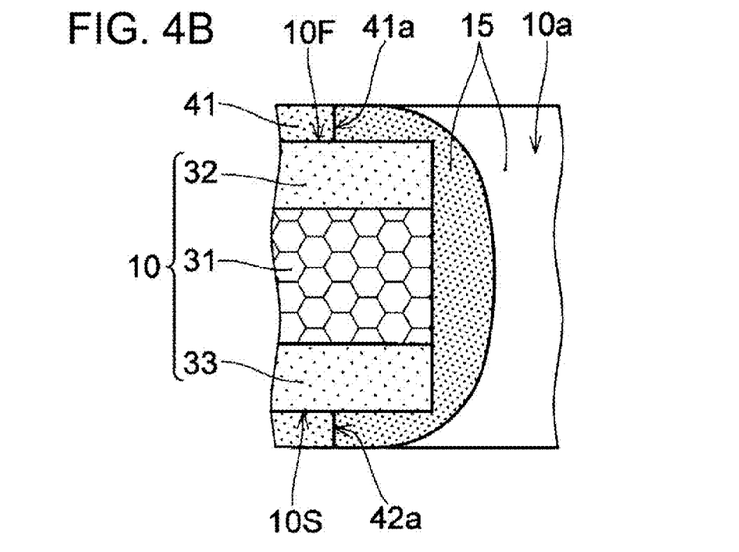
FIG. 4B is a cross-sectional view illustrating another modified embodiment of the wiring substrate of FIG. 1.

The cross-sectional shape of the resin film 15 and relative positional relationships between the edges of the resin film 15 and the openings (41a, 42a) of the solder resist layers (41, 42) are not limited to the cross-sectional shape or the positional relationships illustrated in FIG. 3. FIGS. 4A and 4B respectively illustrate modified embodiments of the wiring substrate 1 of FIG. 1, and respectively illustrate portions corresponding to the portion (III) of FIG. 1 in the modified embodiments.

In the modified embodiment of FIG. 4A, the resin film 15 has a substantially flat surface in a portion covering the inner wall surface (10a1) of the through hole (10a). Since the surface of the resin film 15 is not curved toward the inner side of the through hole (10a), the through hole (10a) can be formed to have a smaller opening size as compared to the example of FIG. 3. The resin film 15 may have such a flat surface in the through hole (10a), or may have a surface that curves to be concave toward the inner wall surface (10a1) of the through hole (10a) as long as the inner wall surface (10a1) is not exposed. Since structures and shapes of configuration elements other than the resin film 15 in FIG. 4A are the same as those in the example of FIG. 3, description about the other configuration elements is omitted.

In the example of FIG. 4B, inner edges of the openings (41a, 42a) of the solder resist layers (41, 42) are respectively in contact with the edges of the resin film 15 on the first surface (10F) and on the second surface (10S) of the laminate 10. The slit 16 formed in the example of FIG. 3 is not formed in the example of FIG. 4B. As in the example of FIG. 4B, it is not always necessary for the resin film 15 to be separated from the inner edges of the openings (41a, 42a) of the solder resist layers (41, 42). For example, when exposure of the second and third insulating layers (32, 33) is unfavorable, opposing surfaces of the resin film 15 and the solder resist layers (41, 42) may be in contact with each other on the first surface (10F) and the second surface (10S) of the laminate 10.

That is, the resin film 15 may cover entire portions of the first surface (10F) and the second surface (10S) of the laminate 10 respectively exposed in the openings (41a, 42a) of the solder resist layers (41, 42). The resin film 15 and the solder resist layers (41, 42) may be intentionally formed to be in contact with each other, or may be unintentionally formed to be in contact with each other when they are formed. Since structures and shapes of configuration elements other than the resin film 15 in FIG. 4B are the same as those in the example of FIG. 3, description about the other configuration elements is omitted.

Figure 4C:
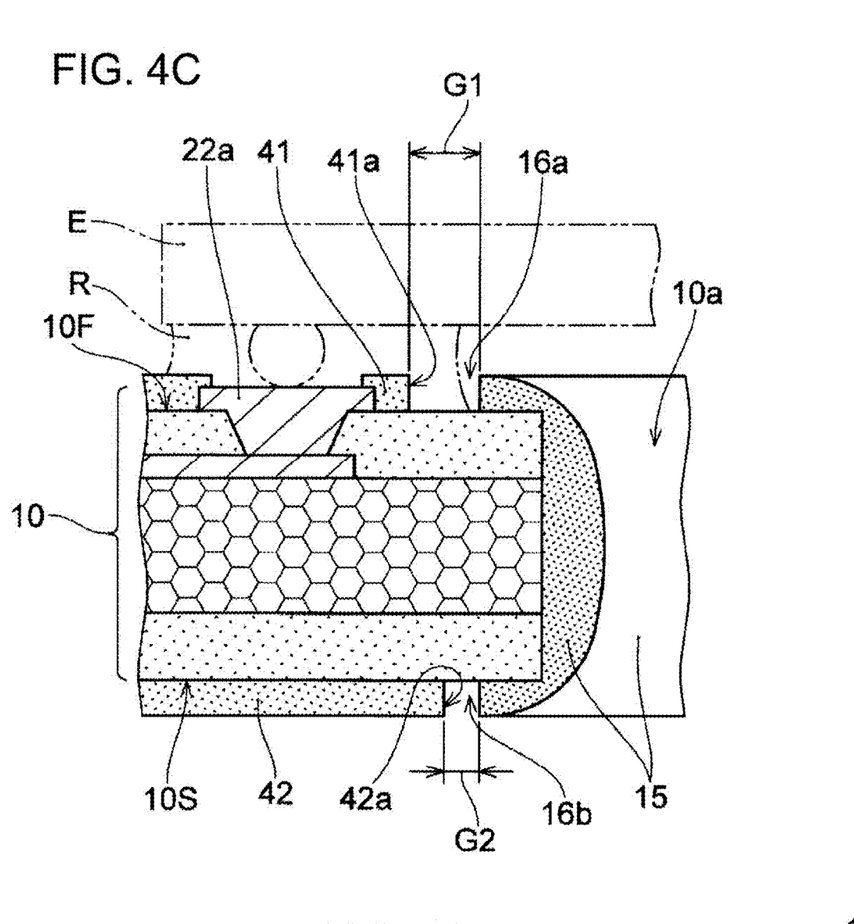
FIG. 4C is a cross-sectional view illustrating yet another modified embodiment of the wiring substrate of FIG. 1.

FIG. 4C illustrates yet another modified embodiment of the wiring substrate 1 of FIG. 1. FIG. 4C illustrates a portion of the modified embodiment corresponding to a portion (IVC) of FIG. 1 together with a portion of the component (E). In the example of FIG. 4C, a gap (G1) between the inner edge of the opening (41a) on the first surface (10F) of the laminate 10 and the resin film 15 and a gap (G2) between the inner edge of the opening (42a) on the second surface (10S) and the resin film 15 and are different from each other. In this way, in the wiring substrate 1 of the embodiment, the gap (G1) and the gap (G2) may be different from each other. In other words, a width of a slit (16a) formed on the first surface (10F) by the solder resist layer 41 and the resin film 15 and a width of a slit (16b) formed on the second surface (10S) by the solder resist layer 42 and the resin film 15 may be different from each other.

In the example of FIG. 4C, the gap (G1) on the first surface (10F) of the laminate 10 is larger than the gap (G2) on the second surface (10S). In the example of FIG. 4C, the connection pads (22a) for the component (E) to be mounted on the wiring substrate 1 in a manner straddling the through hole (10a) are provided on the first surface (10F). After the component (E) is mounted on the wiring substrate 1, a protective resin (R) such as an underfill material may be filled in areas surrounding the connection pads (22a). In this case, in filling the protective resin (R), there is a risk that the protective resin (R) may flow into the through hole (10a). However, when a groove having a relatively large width such as the slit (16a) in the example of FIG. 4C is formed on the first surface (10F), it is thought that a certain amount of the protective resin (R) can flow into and stay in the slit (16a). Therefore, it is thought that the protective resin (R) can be easily prevented from flowing into the through hole (10a).

In the examples illustrated in FIGS. 3 and 4A-4C and the like, thicknesses of the resin film 15 on the first surface (10F) and on the second surface (10S) of the laminate 10 are respectively substantially the same as thicknesses of the solder resist layers (41, 42). However, the thicknesses of the resin film 15 on the first surface (10F) and on the second surface (10S) of the laminate 10 may be respectively larger or smaller than the thicknesses of the solder resist layers (41, 42). For example, the thicknesses of the resin film 15 on the first surface (10F) and on the second surface (10S) of the laminate 10 are each 10 μm or more and 50 μm or less. Further, a maximum thickness of the resin film 15 on the inner wall surface (10a1) of the through hole (10a) is, for example, 10 μm or more and 80 μm or less.

Next, using the wiring substrate 1 illustrated in FIG. 1 as an example, a method for manufacturing a wiring substrate of the embodiment is described with reference to FIGS. 5A-5D.

Figure 5A:
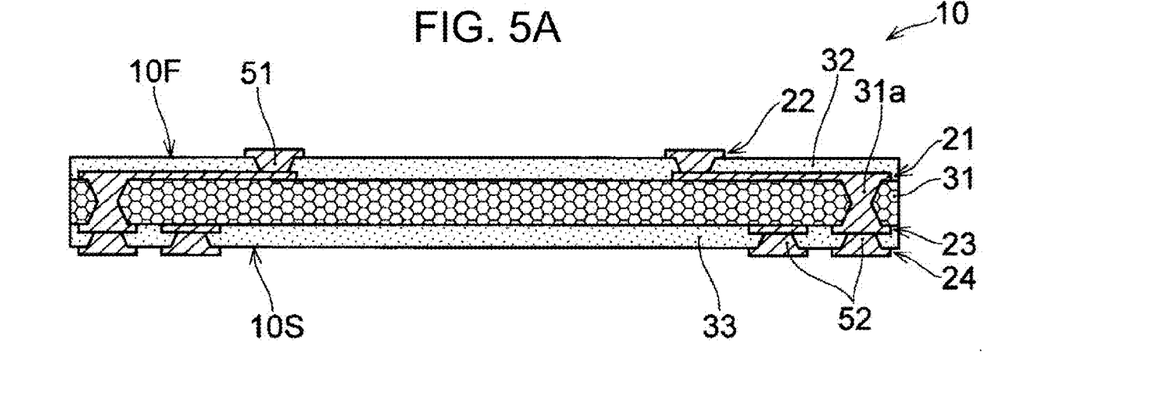
FIG. 5A is a cross-sectional view illustrating an example of a laminate prepared in a method for manufacturing a wiring substrate according to an embodiment of the present invention.

As illustrated in FIG. 5A, the method for manufacturing the wiring substrate of the present embodiment includes preparing the laminate 10 that includes two or more conductor layers (the first-fourth conductor layers (21, 22, 23, 24) in FIG. 5A) and insulating layers (the first-third insulating layers (31, 32, 33) in FIG. 5A) interposed between the two or more conductor layers. The laminate 10 is prepared, for example, by sequentially forming the first conductor layer 21, the second insulating layer 32 and the second conductor layer 22 on one surface of the first insulating layer 31 and sequentially forming the third conductor layer 23, the third insulating layer 33 and the on the other surface of the first insulating layer 31.

For example, a double-sided copper-clad laminated plate is prepared having an insulating substrate (as the first insulating layer 31) and copper foils respectively laminated on both sides of the insulating substrate. Through holes for forming the through-hole conductors (31a) are formed in the double-sided copper-clad laminated plate by laser processing, and a conductor film is formed on inner walls of the through holes and on surfaces of the double-sided copper-clad laminated plate by electroless plating, sputtering or the like. Then, the first conductor layer 21 and the third conductor layer 23 (which have desired conductor patterns) and the through-hole conductors (31a) are formed using a subtractive method which includes electrolytic plating using the conductor film as a seed layer and a power feeding layer and etching using an appropriate mask. That is, the core substrate of the wiring substrate 1 is formed. It is also possible that the first and third conductor layers (21, 23) and the through-hole conductors (31a) are formed using a semi-additive method.

On the first conductor layer 21 and on an exposed surface of the first insulating layer 31 between the conductor patterns of the first conductor layer 21, for example, a sheet-like epoxy resin is laminated and thermocompression-bonded, and thereby, the second insulating layer 32 is formed. By using the same method as that for forming the second insulating layer 32, preferably, simultaneously with the formation of the second insulating layer 32, the third insulating layer 33 is formed on the third conductor layer 23 and on an exposed surface of the first insulating layer 31 between the conductor patterns of the third conductor layer 23. In forming the second and third insulating layers (32, 33), a metal foil such as copper foil may be thermocompression-bonded on each of the second and third insulating layers (32, 33). Holes for forming the via conductors (51, 52) are formed in the second and third insulating layers (32, 33) at predetermined positions by laser irradiation or the like.

Then, for example, by using a semi-additive method, the second conductor layer 22 having desired conductor patterns is formed on the second insulating layer 32, and the via conductors 51 are formed in the second insulating layer 32. Further, by using the same method as that for forming the second conductor layer 22 and the via conductors 51, preferably, simultaneously with the formation of the second conductor layer 22, the fourth conductor layer 24 having desired conductor patterns is formed on the third insulating layer 33, and the via conductors 52 are formed in the third insulating layer 33. For example, through the above processes, the laminate 10 having the first surface (10F) as a surface on the second conductor layer 22 side and the second surface (10S) as a surface on the fourth conductor layer 24 side is prepared.

Figure 5B:
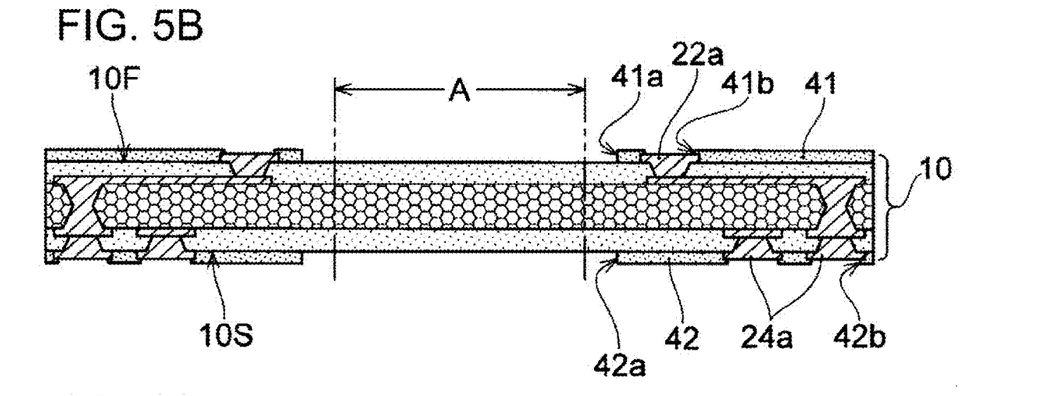
FIG. 5B is a cross-sectional view illustrating an example of a state after solder resist layers are formed in the method for manufacturing the wiring substrate according to the embodiment of the present invention.

As illustrated in FIG. 5B, the method for manufacturing the wiring substrate of the present embodiment further includes forming the solder resist layer 41 covering the first surface (10F) of the laminate 10 and forming the solder resist layer 42 covering the second surface (10S) of the laminate 10. The solder resist layers (41, 42) are formed to respectively have the openings (41a, 42a) exposing a predetermined region (A) of the laminate 10. This predetermined region (A) is a region where the through hole (10a) (see FIG. 5C) is to be formed in the laminate 10 in a subsequent process. That is, the solder resist layer 41 having the opening (41a) which includes the predetermined region (A) where the through hole (10a) is to be formed in a subsequent process, and the solder resist layer 42 having the opening (42a) which includes the predetermined region (A) are formed.

In forming the solder resist layers (41, 42), for example, a photosensitive resin layer containing an epoxy resin, a polyimide resin or the like is formed on each of the first surface (10F) and the second surface (10S) of the laminate 10. Examples of methods for forming the photosensitive resin layer include: deposition of a liquid resin by spray coating, curtain coating, printing, or the like; lamination of a sheet-like resin; and the like. By using a method based on lamination of a sheet-like resin, it is possible that flatter solder resist layers (41, 42) can be formed. The formed resin layers are each subjected to exposure and development using an exposure mask having an appropriate opening pattern, and the openings (41a, 42a) are formed. In manufacturing the wiring substrate 1 in the example of FIG. 1, along with the formation of the openings (41a, 42a), openings (41b, 42b) exposing the connection pads (22a, 24a) are also formed. After the openings (41a, 42a) are formed, the solder resist layers (41, 42) are fully cured to a final state, for example, by heating.

Figure 5C:
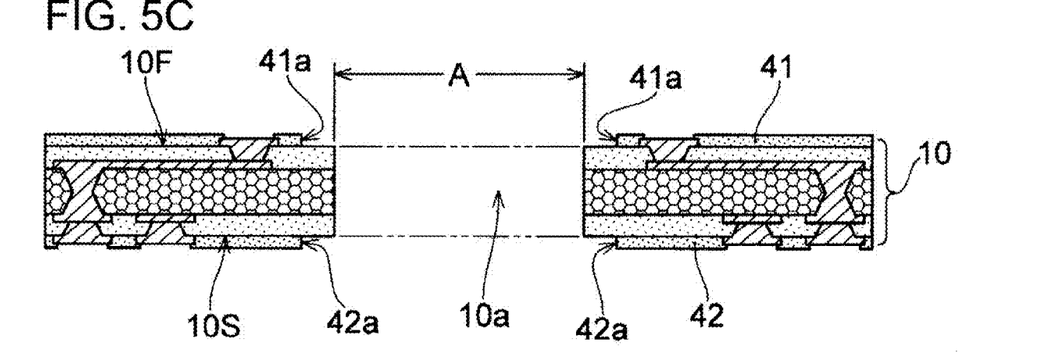
FIG. 5C is a cross-sectional view illustrating an example of a state after a through hole is formed in the method for manufacturing the wiring substrate according to the embodiment of the present invention.

As illustrated in FIG. 5C, the method for manufacturing the wiring substrate of the present embodiment further includes forming the through hole (10a) penetrating the laminate 10 in the thickness direction in the above-described predetermined region (A) of the laminate 10. The through hole (10a) is formed in the openings (41a, 42a) of the solder resist layers (41, 42). By forming the through hole (10a) on an inner side of the inner edges of the openings (41a, 42a), exposed portions not covered by the solder resist layers (41, 42) are respectively provided on the first surface (10F) and the second surface (10S) of the laminate 10.

Examples of methods for forming the through hole (10a) include, but are not limited to, drilling, router processing, laser processing, and the like. When the through hole (10a)

is formed by laser processing, for example, a $CO_2$ laser beam or the like is irradiated along a contour of a formation region of the through hole (10a) in the laminate 10. Then, the through-hole (10a) can be formed by extracting a portion surrounded by the irradiation path of the laser beam.

Figure 5D:
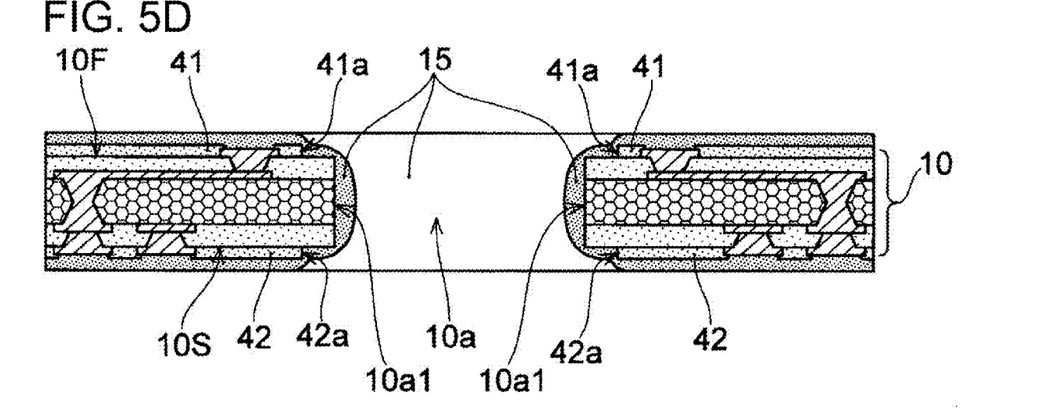
FIG. 5D is a cross-sectional view illustrating an example of a state after a resin film is formed in the method for manufacturing the wiring substrate according to the embodiment of the present invention.

As illustrated in FIG. 5D, the method for manufacturing the wiring substrate of the present embodiment includes forming the resin film 15 covering the inner wall surface (10a1) of the through hole (10a). The resin film 15 is formed to cover the inner wall surface (10a1) of the through hole (10a) and at least partially cover the first surface (10F) and the second surface (10S) of the laminate 10 that are respectively exposed in the openings (41a, 42a) of the solder resist layers (41, 42).

The resin film 15 is formed, for example, by supplying a predetermined resin such as an epoxy resin, a silicone resin, or an acrylic resin to at least an area surrounding the through hole (10a). The predetermined resin such as an epoxy resin can be supplied using any method such as inkjet coating, spin coating, spray coating, or roll coating. By using such a method, a sufficient amount of the resin can also be supplied to the inner wall surface (10a1) of the through hole (10a).

The resin film 15 is finally formed without overlapping the solder resist layers (41, 42). However, in the method for manufacturing the wiring substrate of the present embodiment, as illustrated in FIG. 5D, forming the resin film 15 may include first forming the resin film 15 to cover the solder resist layers (41, 42). In the example of FIG. 5D, an uncured resin film 15 is formed to cover the entire solder resist layers (41, 42) on the first and second surfaces (10F, 10S) of the laminate 10.

When the uncured resin film 15 is formed to cover the solder resist layers (41, 42) as illustrated in FIG. 5D, the method for manufacturing the wiring substrate of the present embodiment includes removing portions of the resin film 15 that respectively cover the solder resist layers (41, 42). This removal is performed, for example, by exposure and development using a mask having an appropriate opening pattern.

In this way, of the uncured resin film 15 formed on the laminate 10 and on the entire solder resist layers (41, 42), portions that respectively cover the solder resist layers (41, 42) are removed. In manufacturing the wiring substrate 1 of FIG. 1, predetermined portions of the resin film 15 are removed such that portions of the first surface (10F) and the second surface (10S) are respectively exposed between the resin film 15 and the openings (41a, 42a) of the solder resist layers (41, 42) after the removal. However, the removal of the predetermined portions is performed such that portions of the resin film 15 that respectively cover the first surface (10F) and the second surface (10S) of the laminate 10 remain. As a result, the resin film 15 that does not overlap with the solder resist layers (41, 42) and covers only desired portions is formed. Thereafter, by heating as needed, the uncured resin film 15 is fully cured. Through the above processes, the wiring substrate 1 illustrated in FIG. 1 is completed.

After the process illustrated in FIG. 5B, a surface protective film (not illustrated in the drawings) may be formed as needed on each of the connection pads (22a, 24a) exposed from the openings (41b, 42b) of the solder resist layers (41, 42). For example, a surface protective film formed of Au, Ni/Au, Ni/Pd/Au, solder, heat-resistant pre-flux, or the like can be formed by electroless plating, solder leveling, spray coating, or the like.

The wiring substrates of the embodiment are not limited to those having the structures illustrated in the drawings and those having the structures, shapes, and materials exemplified herein. For example, the through hole (10a) can be provided at any position of the wiring substrate 1 in plan view. Further, the laminate 10 may be a so-called coreless substrate that does not include a core substrate and is formed by laminating a conductor layer and an insulating layer in one direction. Further, it is not always necessary to form the via conductors (51, 52) and the through-hole conductors (31a).

The method for manufacturing the wiring substrate of the embodiment is not limited the method described with reference to the drawings. For example, it is also possible that the second and fourth conductor layers (22, 24) are patterned using a subtractive method. Further, it is not always necessary for the resin film 15 to be formed to temporarily cover the solder resist layers (41, 42) in the formation process. For example, it is also possible that the resin film 15 covering only the desired portions is formed from the beginning in the formation of the resin film 15 by spray coating or the like using a mask. In the method for manufacturing the wiring substrate of the embodiment, it is also possible that any process other than the processes described above is added, or some of the processes described above are omitted.

In the wiring substrate described in Japanese Patent Application Laid-Open Publication No. 2014-230010, fragments of a material of the wiring substrate may be released or fall off from a wall surface of the opening part, and this may affect quality of a device in which the wiring substrate is used.

A wiring substrate according to an embodiment of the present invention includes: a laminate that has a first surface and a second surface on an opposite side with respect to the first surface and includes two or more conductor layers and insulating layers respectively interposed between the two or more conductor layers; solder resist layers that respectively cover the first surface and the second surface of the laminate; and a resin film that partially covers exposed surfaces of the laminate not covered by the solder resist layers. The laminate further has a through hole penetrating the laminate in a thickness direction. The solder resist layers each have an opening exposing the through hole. The resin film is formed inside the openings so as not to overlap with the solder resist layers on the first and second surfaces, and at least partially covers the first surface and the second surface exposed inside the openings and covers an inner wall surface of the through hole.

A method for manufacturing a wiring substrate according to another embodiment of the present invention includes: preparing a laminate that includes two or more conductor layers and insulating layers respectively interposed between the two or more conductor layers; forming solder resist layers respectively on a first surface and on a second surface of the laminate, the solder resist layers each having an opening exposing a predetermined region of the laminate; forming a through hole penetrating the laminate in a thickness direction in the predetermined region of the laminate; and forming a resin film in a manner not overlapping with the solder resist layers, the resin film at least partially covering the first and second surfaces respectively exposed in the openings and covering an inner wall surface of the through hole.

According to a wiring substrate of an embodiment of the present invention, in a wiring substrate having a through hole, it is thought that dust emission from an inner wall of the through hole can be suppressed and quality of a device in which the wiring substrate is used can be improved. According to a method for manufacturing a wiring substrate of an embodiment of the present invention, a wiring substrate having less dust emission from an inner wall of a through hole can be manufactured.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
   a laminate having a through hole and comprising a plurality of conductor layers and a plurality of insulating layers interposed between the plurality of conductor layers respectively such that the through hole penetrates through the laminate in a thickness direction of the laminate;
   a plurality of solder resist layers formed on the laminate such that the plurality of solder resist layers includes a first solder resist layer covering a first surface of the laminate and a second solder resist layer covering a second surface of the laminate on an opposite side with respect to the first surface and that the first and second solder resist layers have openings exposing the through hole respectively; and
   a resin film partially covering exposed surfaces of the laminate not covered by the solder resist layers such that the resin film is formed on the first and second surfaces of the laminate inside the openings of the first and second solder resist layers without overlapping with the first and second solder resist layers on the first and second surfaces and that the resin film covers an inner wall surface inside the through hole and at least part of the first and second surfaces exposed inside the openings,
   wherein the resin film is formed such that the resin film has a convex surface portion covering the inner wall surface inside the through hole and curving toward an inner side of the through hole.

2. The wiring substrate according to claim 1, wherein the resin film is formed such that the first and second solder resist layers have inner edges of the openings separated from edges of the resin film on the first and second surfaces respectively.

3. The wiring substrate according to claim 2, wherein the plurality of conductor layers includes an outermost conductor layer on a first surface side and an outermost conductor layer on a second surface side, and at least one of the outermost conductor layers has a plurality of connection pads.

4. The wiring substrate according to claim 2, wherein the plurality of conductor layers includes an outermost conductor layer on a first surface side and an outermost conductor layer on a second surface side, and at least one of the outermost conductor layers has a plurality of connection pads positioned to mount an electronic component or an optical component on the laminate such that the electronic component or the optical component straddles the through hole.

5. The wiring substrate according to claim 2, wherein the laminate includes a core substrate comprising one of the insulating layers and first and second conductor layers of the conductor layers such that the first conductor layer is formed on a first surface of the one of the insulating layers and that the second conductor layer is formed on a second surface of the one of the insulating layers.

6. The wiring substrate according to claim 1, wherein the resin film is formed such that the first and second solder resist layers have inner edges of the openings in contact with edges of the resin film on the first and second surfaces respectively.

7. The wiring substrate according to claim 6, wherein the plurality of conductor layers includes an outermost conductor layer on a first surface side and an outermost conductor layer on a second surface side, and at least one of the outermost conductor layers has a plurality of connection pads.

8. The wiring substrate according to claim 6, wherein the plurality of conductor layers includes an outermost conductor layer on a first surface side and an outermost conductor layer on a second surface side, and at least one of the outermost conductor layers has a plurality of connection pads positioned to mount an electronic component or an optical component on the laminate such that the electronic component or the optical component straddles the through hole.

9. The wiring substrate according to claim 6, wherein the laminate includes a core substrate comprising one of the insulating layers and first and second conductor layers of the conductor layers such that the first conductor layer is found on a first surface of the one of the insulating layers and that the second conductor layer is formed on a second surface of the one of the insulating layers.

10. The wiring substrate according to claim 1, wherein the plurality of conductor layers includes an outermost conductor layer on a first surface side and an outermost conductor layer on a second surface side, and at least one of the outermost conductor layers has a plurality of connection pads.

11. The wiring substrate according to claim 1, wherein the laminate includes a core substrate comprising one of the insulating layers and first and second conductor layers of the conductor layers such that the first conductor layer is formed on a first surface of the one of the insulating layers and that the second conductor layer is formed on a second surface of the one of the insulating layers.

12. The wiring substrate according to claim 11, wherein the core substrate includes a plurality of through hole conductors formed through the one of the insulating layers such that the plurality of through hole conductors connects the first and second conductor layers of the core substrate.

13. A method for manufacturing a wiring substrate, comprising:
   preparing a laminate comprising a plurality of conductor layers and a plurality of insulating layers interposed between the plurality of conductor layers respectively;
   forming a plurality of solder resist layers on the laminate such that the plurality of solder resist layers includes a first solder resist layer covering a first surface of the laminate and a second solder resist layer covering a second surface of the laminate on an opposite side with respect to the first surface and that the first and second solder resist layers have openings respectively;
   forming a through hole penetrating through the laminate in a thickness direction of the laminate such that the first and second solder resist layers have the openings exposing the through hole respectively; and
   forming a resin film partially covering exposed surfaces of the laminate not covered by the solder resist layers such that the resin film is formed on the first and second surfaces of the laminate inside the openings of the first and second solder resist layers without overlapping with the first and second solder resist layers on the first and second surfaces and that the resin film covers an inner wall surface inside the through hole and at least part of the first and second surfaces exposed inside the openings, wherein the resin film is formed such that the resin film has a convex surface portion covering the inner wall surface inside the through hole and curving toward an inner side of the through hole.

14. The method for manufacturing a wiring substrate according to claim 13, wherein the forming of the resin film includes forming the resin film such that the rein film covers the solder resist layers, and removing part of the resin film covering the solder resist layers from the resin film.

15. The method for manufacturing a wiring substrate according to claim 13, wherein the resin film is formed such that the first and second solder resist layers have inner edges of the openings separated from edges of the resin film on the first and second surfaces respectively.

16. The method for manufacturing a wiring substrate according to claim 13, wherein the resin film is formed such that the first and second solder resist layers have inner edges of the openings in contact with edges of the resin film on the first and second surfaces respectively.

17. The method for manufacturing a wiring substrate according to claim 13, wherein the plurality of conductor layers includes an outermost conductor layer on a first surface side and an outermost conductor layer on a second surface side, and at least one of the outermost conductor layers has a plurality of connection pads positioned to mount an electronic component or an optical component on the laminate such that the electronic component or the optical component straddles the through hole.

18. A wiring substrate, comprising:
a laminate having a through hole and comprising a plurality of conductor layers and a plurality of insulating layers interposed between the plurality of conductor layers respectively such that the through hole penetrates through the laminate in a thickness direction of the laminate;
a plurality of solder resist layers formed on the laminate such that the plurality of solder resist layers includes a first solder resist layer covering a first surface of the laminate and a second solder resist layer covering a second surface of the laminate on an opposite side with respect to the first surface and that the first and second solder resist layers have openings exposing the through hole respectively; and
a resin film partially covering exposed surfaces of the laminate not covered by the solder resist layers such that the resin film is formed on the first and second surfaces of the laminate inside the openings of the first and second solder resist layers without overlapping with the first and second solder resist layers on the first and second surfaces and that the resin film covers an inner wall surface inside the through hole and at least part of the first and second surfaces exposed inside the openings, wherein the resin film is formed such that the resin film has a convex surface portion covering the inner wall surface inside the through hole and curving toward an inner side of the through hole, the plurality of conductor layers includes an outermost conductor layer on a first surface side and an outermost conductor layer on a second surface side, and at least one of the outermost conductor layers has a plurality of connection pads positioned to mount an electronic component or an optical component on the laminate such that the electronic component or the optical component straddles the through hole.

19. The wiring substrate according to claim 18, wherein the laminate includes a core substrate comprising one of the insulating layers and first and second conductor layers of the conductor layers such that the first conductor layer is formed on a first surface of the one of the insulating layers and that the second conductor layer is formed on a second surface of the one of the insulating layers.

20. The wiring substrate according to claim 19, wherein the core substrate includes a plurality of through hole conductors formed through the one of the insulating layers such that the plurality of through hole conductors connects the first and second conductor layers of the core substrate.

* * * * *